(12) United States Patent
Hilliger et al.

(10) Patent No.: US 6,858,442 B2
(45) Date of Patent: Feb. 22, 2005

(54) FERROELECTRIC MEMORY INTEGRATED CIRCUIT WITH IMPROVED RELIABILITY

(75) Inventors: Andreas Hilliger, Kanagawa (JP); Uwe Wellhausen, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 116 days.

(21) Appl. No.: 10/248,861

(22) Filed: Feb. 25, 2003

(65) Prior Publication Data

US 2004/0166629 A1 Aug. 26, 2004

(51) Int. Cl.$^7$ .................................... H01L 21/8142
(52) U.S. Cl. ...................... 438/3; 438/240; 438/672
(58) Field of Search ............................ 438/3, 238–240, 438/256, 381, 393–399

(56) References Cited

U.S. PATENT DOCUMENTS

| | | | |
|---|---|---|---|
| 5,789,320 A | 8/1998 | Andricacos et al. | 438/678 |
| 5,866,946 A | 2/1999 | Kamigaki et al. | 257/751 |
| 6,037,235 A | 3/2000 | Narwankar et al. | 438/396 |
| 6,121,083 A * | 9/2000 | Matsuki | 438/254 |
| 6,211,035 B1 * | 4/2001 | Moise et al. | 438/396 |
| 6,281,535 B1 | 8/2001 | Ma et al. | 257/295 |
| 6,320,213 B1 | 11/2001 | Kirlin et al. | 257/295 |
| 6,365,927 B1 | 4/2002 | Cuchiaro et al. | 257/295 |
| 6,485,988 B2 * | 11/2002 | Ma et al. | 438/3 |
| 6,611,449 B1 * | 8/2003 | Hilliger | 365/145 |

* cited by examiner

*Primary Examiner*—H. Jey Tsai
(74) *Attorney, Agent, or Firm*—Horizon IP Pte Ltd

(57) ABSTRACT

A memory cell having capacitor with top and bottom electrodes with a dielectric layer between is described. The bottom electrode is coupled to a first diffusion region of a transistor by a bottom electrode plug. A dielectric layer covers the capacitor. Above the dielectric layer is a first barrier layer. A via is created in the dielectric layer in which a plug is formed to couple to the second diffusion region. The via comprises substantially vertical sidewalls. A second barrier layer lines the sidewalls of the via. A conductive material is then deposited on the substrate, filling the via to form the plug. By providing the first and second barrier layers, the diffusion of hydrogen which can adversely impact the capacitor is reduced, thereby improving the reliability.

31 Claims, 9 Drawing Sheets

FERROELECTRIC MEMORY INTEGRATED CIRCUIT WITH IMPROVED RELIABILITY

BACKGROUND OF INVENTION

Ferroelectric metal oxide ceramic materials such as lead zirconate titanate (PZT) have been investigated for use In ferroelectric semiconductor memory devices. Other ferroelectric materials, for example, strontium bismuth tantalate (SBT) can also be used. The ferroelectric material Is located between two electrodes to form a ferroelectric capacitor for storing information. Ferroelectric capacitor uses the hysteresis polarization characteristic of the ferroelectric material for storing information. The logic value stored in the memory cell depends on the polarization of the ferroelectric capacitor. To change the polarization of the capacitor, a voltage which is greater than the switching voltage (coercive voltage) needs to be applied across its electrodes. The polarization of the capacitor depends on the polarity of the voltage applied. An advantage of the ferroelectric capacitor is that It retains its polarization state after power is removed, resulting in a non-volatile memory cell.

FIG. 1 shows a plurality of ferroelectric memory cells configured in a group 103. Such a memory architecture is described in, for example, Takashima et al., IEEE J. Solid-State Circuits, vol. 33, pp 787–792, May 1998, which Is herein Incorporated by reference for all purposes. The group, for example, comprises 8 memory cells. Groups of other sizes are also useful. Preferably, the number of cells within a group is equal to $2^y$, where y=a whole number$\geq 1$. The memory cells 140 of the group, each with a transistor 142 coupled to a ferroelectric capacitor 144 in parallel, are coupled in series. The gates of the cell transistors are, for example, gate conductors which either serve as or are coupled to wordlines 160. One end of the group is coupled to a bitline 150 via a block select transistor 108 while the other end is coupled to a plateline 170. A plurality of groups are Interconnected by wordlines to form a memory block or array.

FIG. 2 shows a cross-section of a conventional memory group 103. As shown, the transistors 142 of the memory cells are formed on a substrate 205. Adjacent cell transistors share a common diffusion region. The capacitors 144 of the memory group are arranged in pairs. The bottom electrode 246 serves as a common electrode for adjacent capacitors. The bottom capacitor electrodes are each coupled to the cell transistors via plugs 274. The top electrode 248 of a capacitor from a capacitor pair is coupled to the top electrode of a capacitor of an adjacent pair. The top capacitor electrodes are coupled to the cell transistors via top electrode plugs 276.

FIGS. 3–4 show a portion of the process for forming a conventional ferroelectric memory group 103. Referring to FIG. 3, a substrate 105 with a partially formed memory cell 140 of a memory group is provided. As shown, the front end of line (FEOL) portion of the memory cell is formed (e.g., up to the formation of the contact that couples the top capacitor electrode to the cell transistor). The partially formed memory cell includes a transistor 142 with first and second diffusion regions 338 and 339. A ferroelectric capacitor 144 is provided. The ferroelectric capacitor includes a ferroelectric layer 349 between top and bottom electrodes 248 and 246. The bottom electrode Is a common electrode with a capacitor of an adjacent memory cell. The bottom electrode Is coupled to the first diffusion region of the transistor via a bottom electrode plug 274. To prevent oxidation of the plug, a barrier layer 368 is disposed between the bottom electrode and plug. An encapsulation layer 384 is also provided to cover the capacitors. The encapsulation layer protects the capacitors from hydrogen. Additionally, the encapsulation protects the plug 274 from oxygen.

Conventionally, the plug that connects the top electrode (active area top electrode plug or AATE plug) to the second diffusion region of the transistor is formed in two separate process steps. As shown, the partially formed memory cell Includes a lower portion 376 of the AATE plug. A barrier layer 382 is provided above the lower portion of the AATE plug. The barrier layer serves to prevent oxygen from oxidizing the plug 376. Referring to FIG. 4, the process continues by forming upper portion of the AATE plug. A resist layer is deposited over the ILD and patterned to form an etch mask, exposing portions of the ILD. An anisotropic etch is performed to remove the exposed portions of the ILD, forming vias 472. Due to the depth of via 472, the sidewalls have a non-vertical profile (e.g., slanted).

Subsequently, a barrier layer 492 is deposited over the substrate to line the sidewalls and bottom of the vias. The barrier layer, for example, comprises silicon nitride or aluminum oxide. A reactive ion etch (RIE) is performed to remove the horizontal components of the barrier layer, leaving it lining only the sidewalls of the vias while exposing the lower portion of the plug and top capacitor electrodes. However, due to the slanted profile of via 472, the etch also removes some of the barrier material lining the sidewalls, compromising the integrity of the barrier. This can lead to failures since hydrogen can now penetrate to the capacitor, degrading the properties of the ferroelectric material.

From the foregoing discussion, it is desirable to provide an AATE plug with improved sidewall profile to increase reliability.

SUMMARY OF INVENTION

The invention relates to fabrication of integrated circuits. More particularly, the invention relates to fabrication of memory cells in integrated circuits. In one embodiment, a substrate is provided which is prepared with a transistor having first and second diffusion regions and a gate and a capacitor having at least top and bottom electrodes with a dielectric layer between the electrodes. The bottom electrode is coupled to the first diffusion region via a bottom electrode plug. A dielectric layer is deposited over the capacitor.

In one embodiment, a first barrier layer is deposited over the dielectric layer. A contact opening is formed in the dielectric layer. The contact opening is used to form a plug for contacting the second diffusion region of the transistor. The contact opening is formed with substantially vertical sidewalls. A second barrier layer is then formed, lining the sidewalls of the contact opening. A plug is then formed in the contact opening.

By providing a contact opening with substantially vertical sidewalls, the thickness of the second barrier layer lining the sidewalls of the contact opening can be maintained more consistently during processing. For example, the impact of the anisotropic etch that removes the horizontal portions of the second barrier layer to expose the underlying contact region (either lower portion of the plug or diffusion region of the transistor) would be less on the vertical component due to the substantial vertical sidewalls of the via. As a result, the diffusion of hydrogen which can adversely impact the Integrity of capacitor is reduced.

DETAILED DESCRIPTION

The invention relates generally to the fabrication of ICs. More particularly, the invention relates to improving contact formation In ferroelectric memory ICs. Although the invention has been described in the context of forming AATE plugs in ferroelectric memory ICs with series architecture, it is also applicable to other types of memory ICs. For example, the invention may used to form non-ferroelectric memory ICs or memory ICs with other types of architectures.

Figure 1:
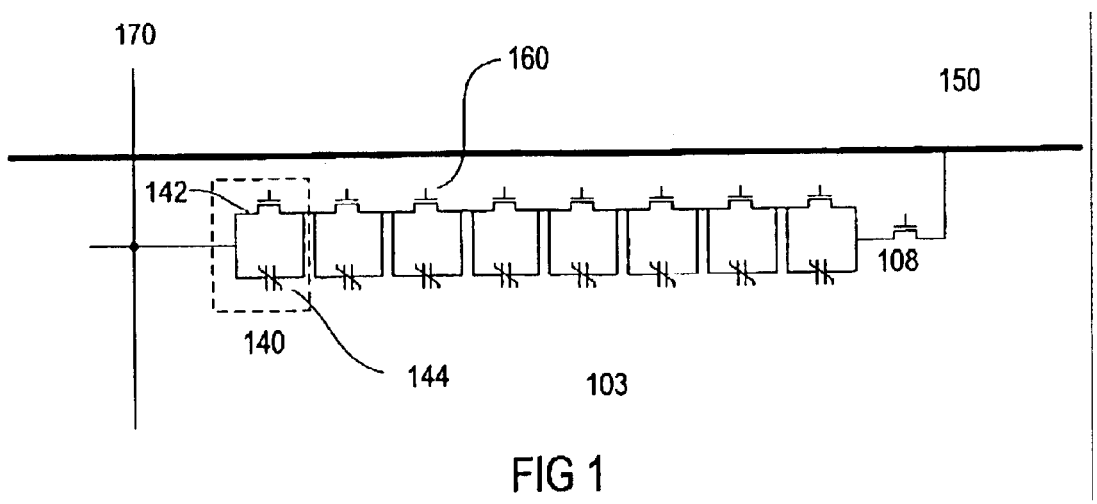
FIG. 1 shows a conventional ferroelectric memory group.
Figure 2:
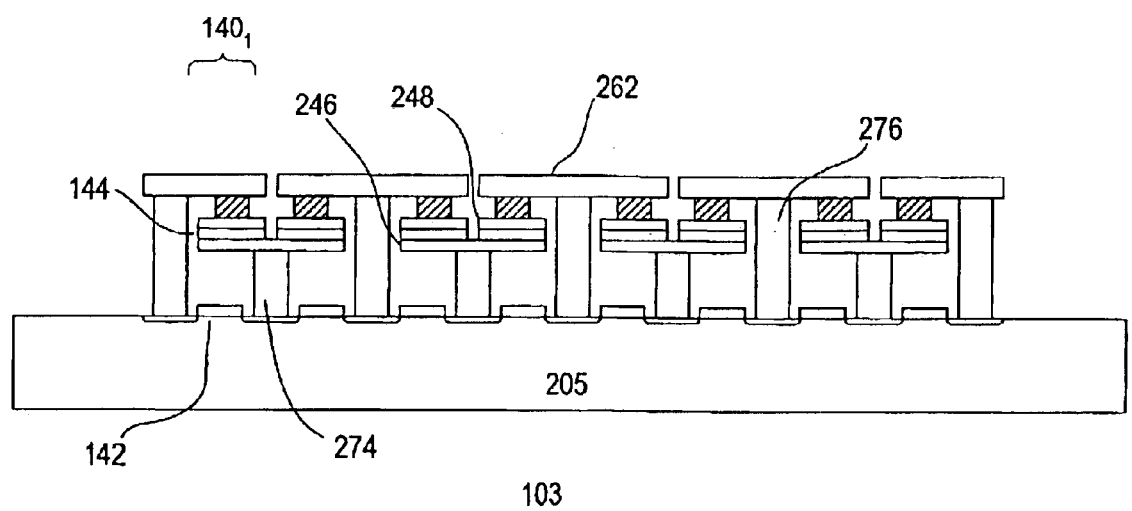
FIG. 2 shows a cross section of a conventional memory group.
Figure 3:
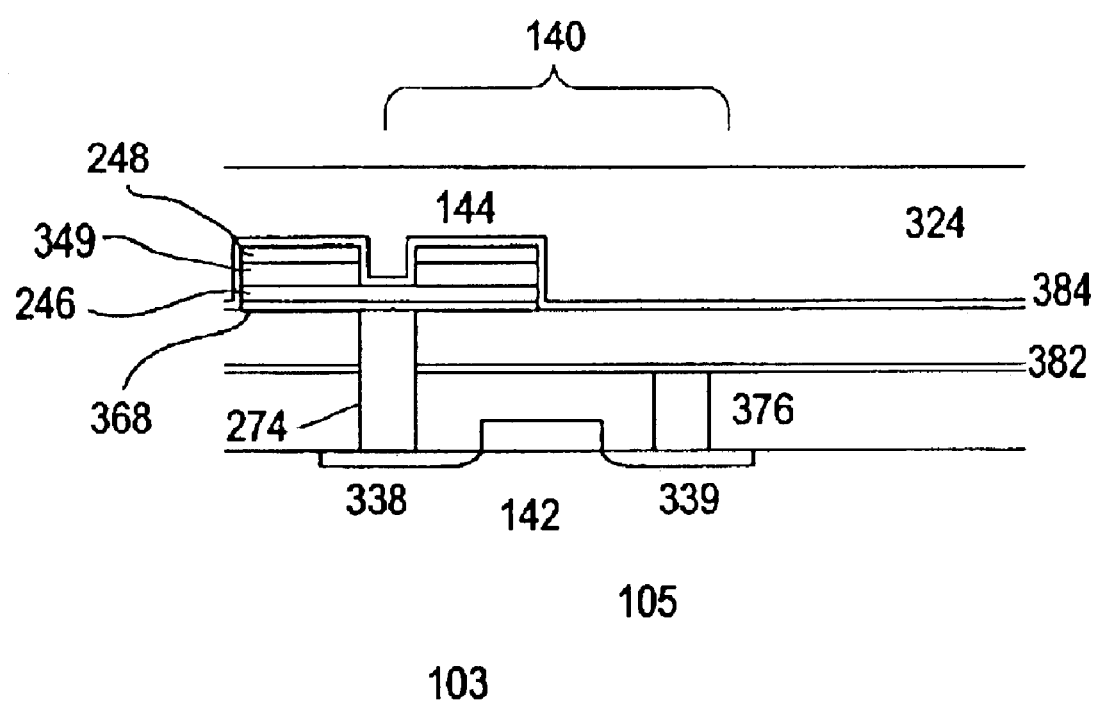
FIGS. 3–4 show a process for forming contacts in a conventional memory group.
Figure 4:
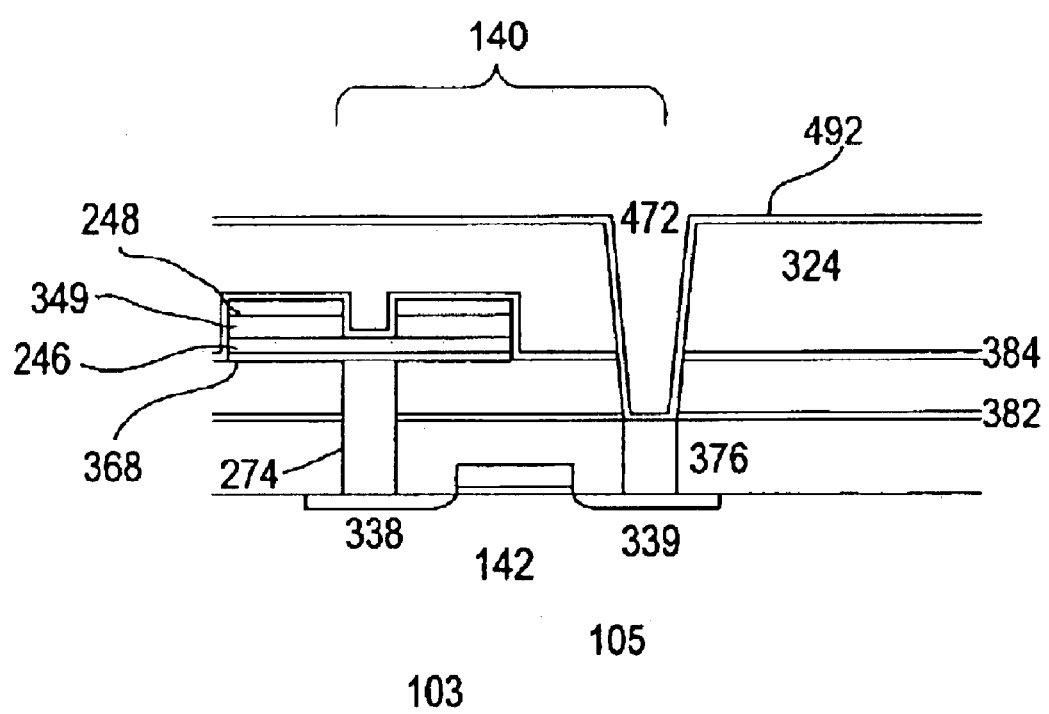
Figure 5:
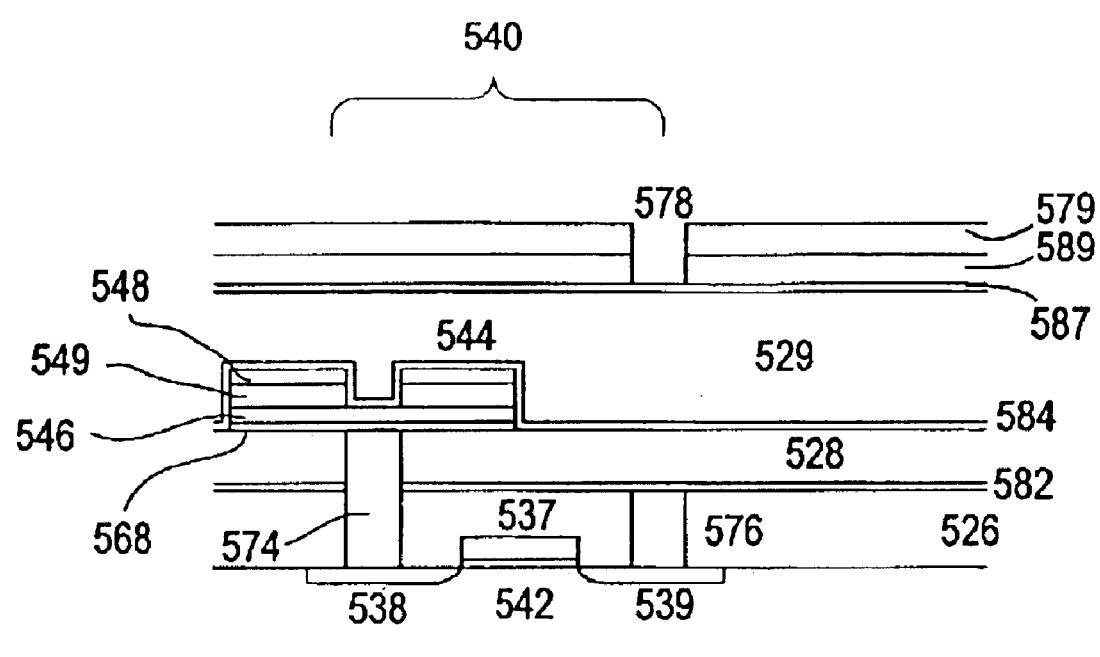
FIGS. 5–9 show a process for forming contacts in a memory group in accordance with one embodiment of the invention.

FIGS. 5–9 show a process for forming ferroelectric memory ICs in accordance with one embodiment of the invention. Referring to FIG. 5, a substrate 505 with a partially formed memory cell 540 of a memory group Is shown. Although only one memory cell is shown for purpose of discussion, it is understood that additional cells are included. The FEOL portion of the memory cell can be fabricated using conventional processing steps.

In one embodiment, the FEOL portion of the cell is formed by providing a semiconductor substrate 505. The substrate, for example, comprises silicon. Other types of semiconductor substrates can also be used. The substrate is prepared with a transistor 542 having a gate 537 and first and second diffusion regions 538 and 539. The gate, for example, Is a gate conductor that interconnects to other memory cells. A dielectric layer 526 such as silicon dioxide ($SiO_2$) is deposited over the transistor. Other types of dielectric material, such as silicon nitride, spin-on glass (SOG), or doped or undoped silicate glass, are also useful. In one embodiment, the dielectric layer is deposited using conventional techniques. Such techniques include, for example, chemical vapor deposition (CVD) or spin-on.

A plug 576 is formed in the dielectric layer, coupling to the second diffusion region 539 of the transistor. In one embodiment, the plug serves as the lower portion of the AATE plug. The plug can be formed by, for example, etching a via (or contact opening) and filling it with conductive material. The conductive material comprises, for example, tungsten (W). Other types of conductive materials, such as doped polysilicon, are also useful. The tungsten is deposited, in one embodiment, by CVD. Other deposition techniques are also useful. Excess conductive material can be removed from the surface of the dielectric layer using, for example, a chemical mechanical polishing (CMP) or etch back process.

After the CMP, a barrier layer 582 is deposited over the dielectric layer to protect the tungsten filled contacts from oxygen. This layer also serves to protect the capacitor from being penetrated by hydrogen from below during a hydrogen (containing) anneal. Preferably, the barrier layer comprises a non-conductive or dielectric material. In one embodiment, the barrier layer comprises silicon nitride. Other types of barrier materials which inhibit diffusion of oxygen and hydrogen, such as aluminum oxide, are also useful. A second dielectric or ILD layer 528 is deposited over the barrier layer followed by the formation of a bottom electrode plug 574 that contacts the first diffusion region 538 of the transistor. The plug can be formed using conventional techniques.

The process continues to form the capacitor. In one embodiment, a ferroelectric capacitor is formed. Forming other types of capacitors can also be useful. Preferably, the process forms a capacitor pair, such as those used to form series architecture. The capacitor pair, for example, is formed in two separate processes. In one embodiment, an adhesion layer (not shown) and a barrier layer 568 are deposited on the dielectric layer. The adhesion layer, for example, comprises titanium or other types of materials which promote adhesion between the dielectric layer and barrier layer. The barrier layer, in one embodiment, comprises iridium or iridium oxide. Other barrier materials which prevent diffusion of, for example, oxygen are also useful.

Above the barrier layer, a first electrode layer 546, ferroelectric material 549 and second electrode layer 548 are deposited. The electrode material comprises, for example, a metal such as platinum. Other types of conductive materials, such as iridium or iridium oxide, can also be used to form the electrode. It is understood that the first and second electrodes need not be formed of the same material. The ferroelectric layer, in one embodiment, comprises PZT. Other ferroelectric materials are also useful. The layers are patterned to form capacitors.

In one embodiment, the layers are patterned to form capacitor pairs 544 of a series architecture. In one embodiment, the capacitor pairs are formed by first patterning the second or top electrode and ferroelectric layers. A slight overetch can be performed to ensure that the ferroelectric layers of the capacitor pairs of separated. Next, the first electrode layer is patterned to complete the formation the capacitor pairs by defining the common bottom electrode of a pair. Other techniques for forming the capacitor pairs are also useful. Alternatively, the process forms a capacitor using a single process. For example, the various layers of the capacitor are deposited and then patterned together. The various capacitor layers are patterned using, for example, convention mask and etch techniques. In one embodiment, a hard mask can be used to pattern the layers of the capacitors.

An encapsulation layer 584 is deposited over the substrate, covering the capacitor and dielectric layer. The encapsulation layer serves, for example, to protect the capacitor from hydrogen and the bottom contact 574 from oxygen. In one embodiment, the encapsulation layer comprises aluminum oxide. Other types of materials, such as silicon nitride, are also useful. A third dielectric or ILD layer 529 is deposited over the substrate, covering the capacitors. In one embodiment, the dielectric layer comprises $SiO_2$. Other dielectric materials are also useful. The dielectric layer is deposited using conventional techniques.

In accordance with one embodiment of the invention, a barrier layer 587 is deposited on the surface of the third dielectric layer. The barrier layer Inhibits the penetration of hydrogen. Preferably, the barrier layer comprises a non-conductive or dielectric material. In one embodiment, the barrier comprises silicon nitride. Other barrier materials, such as aluminum oxide, are also useful. In one embodiment, a hard mask layer 589 is then deposited over the barrier layer. The hard mask, for example, comprises polysilicon. Other hard mask materials which can be etched selective to the barrier layer and ILD materials, are also useful. Conventional techniques, such as CVD, are used to deposit the hard mask and barrier layer. The hard mask layer serves as an etch mask for forming the upper portion of the AATE plug. Alternatively, for applications where the AATE plug is formed in a single process, the hard mask is used to form the AATE plug. To pattern the hard mask, a photoresist layer 579 is used. The photoresist layer is patterned to create an opening 578 corresponding to the area where the upper portion of the top electrode contact plug is to be formed. The portion of the hard mask exposed or unprotected by the resist is removed by, for example, an anisotropic etch.

Figure 6:
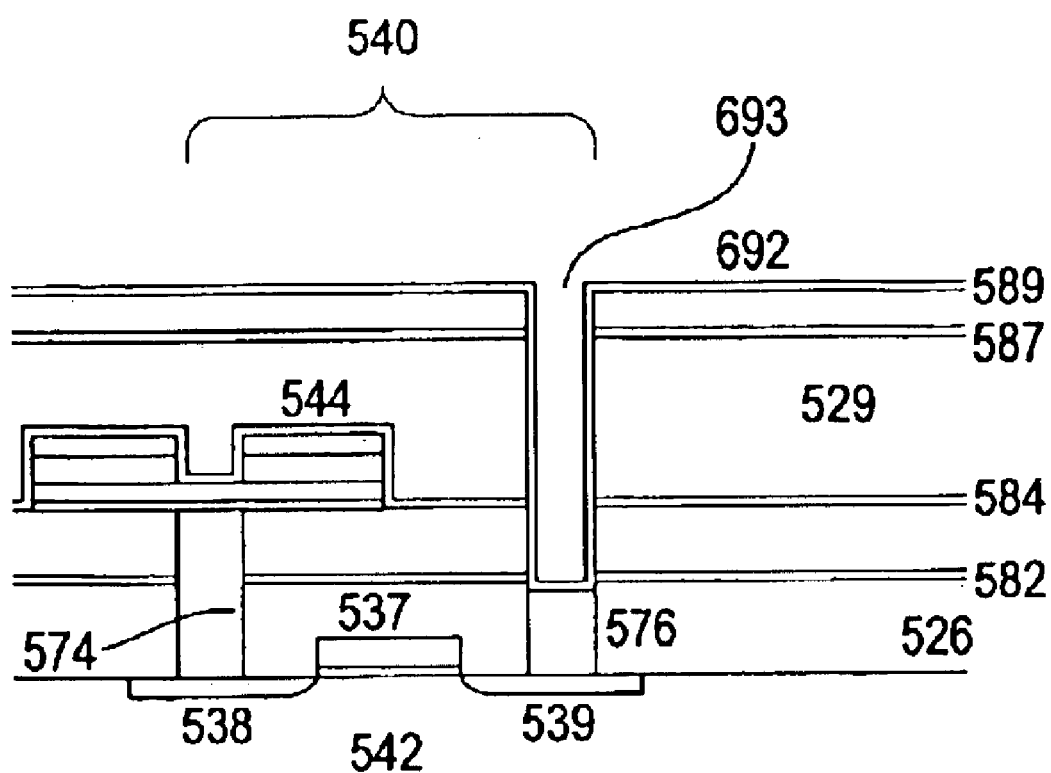

As shown in FIG. 6, the substrate is anisotropically etched by, for example RIE, to create via 693 to the lower portion of the top electrode plug. Using a hard mask advantageously enables relatively deep vias to be created with vertical or substantially vertical profiles. The ILD material as well as the barrier layers 584 and 582 are slightly overetched, ensuring that the surface of the lower portion of the AATE plug (or diffusion region) is exposed. The overetch recesses the plug slightly below the lower surface of the barrier layer 582. After the via is created, a barrier layer 692 is conformally deposited on the substrate, covering the surface of the hard mask 589 as well as the sidewalls and bottom of the via.

Figure 7:
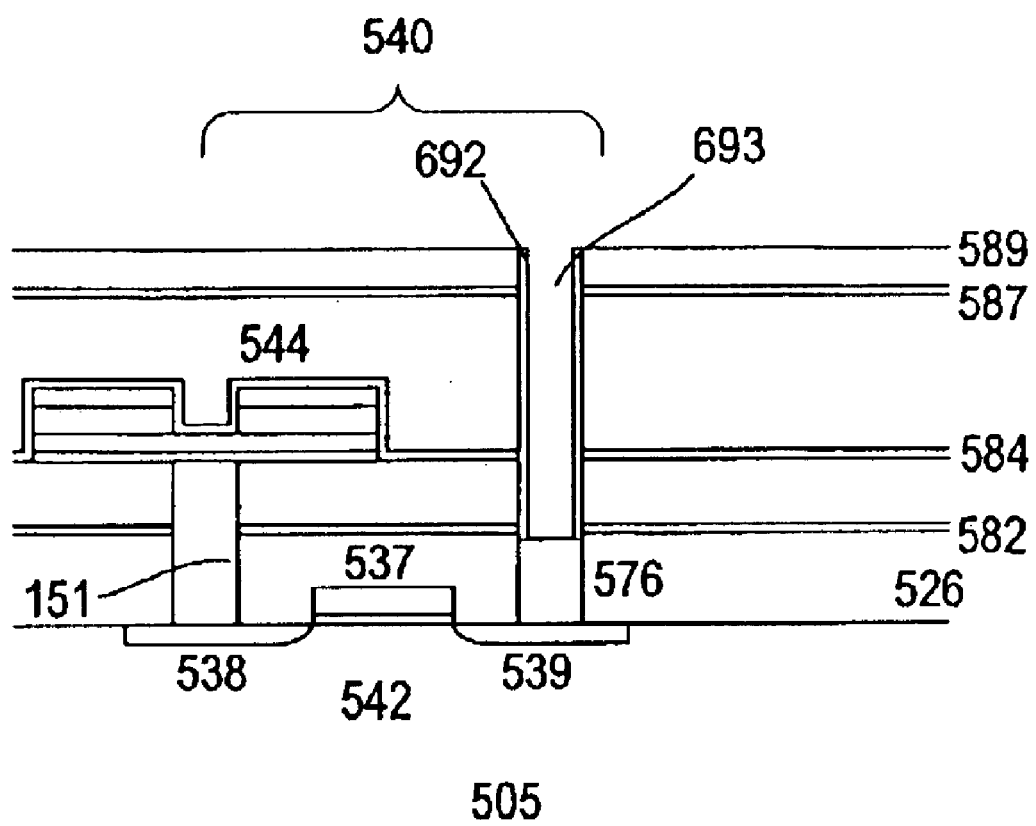

Referring to FIG. 7, an anisotropic etch is performed to etch back the barrier layer, exposing the hard mask and upper surface of the plug 576 while leaving the sidewalls protected. At this point in the BEOL process, the substrate can be annealed in a hydrogen ambient to repair the interface states in the gate oxide of the transistor 542. Due to vertical or substantially vertical sidewalls of via 693, the thickness of the barrier layer 692 lining the via sidewalls is maintained to ensure good barrier properties against the diffusion of hydrogen. Since the bottom of barrier layer 692 is below the barrier layer 582, diffusion of hydrogen to the capacitor from below is prevented. Also, the barrier layer 587 on the surface of the ILD layer provides additional protection against the diffusion of hydrogen to the capacitors from above.

Figure 8:
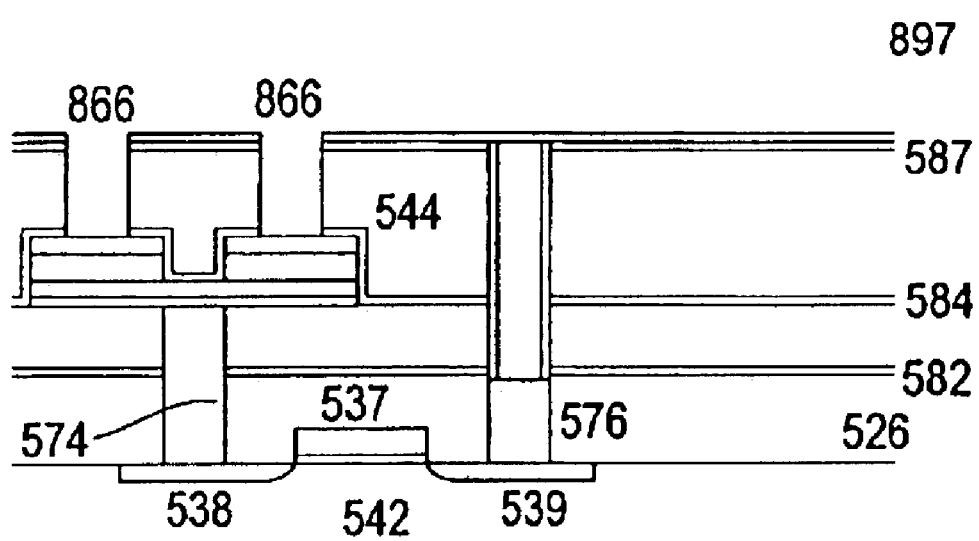

Referring to FIG. 8, a conductive material is deposited on the substrate, filling the via. The conductive material comprises, in one embodiment, tungsten. Other types of conductive materials with good high aspect ratio plug filling property are also useful. Excess conductive material is removed from the surface of the hard mask by a polishing step, such as CMP. The hard mask is also removed, as part of the CMP process or as a separate etch step, using the barrier layer as a CMP or etch stop.

After the AATE plug is completed, a protective layer is deposited on the surface of the substrate. The protective layer serves as a barrier against oxygen, preventing the plug from oxidizing during subsequent processing steps. In one embodiment, the protective layer 897 comprises, for example, silicon nitride. Other materials that can be removed selectively to the barrier layer 587, such as aluminum oxide, are also useful.

In one embodiment, contact openings 866 are then formed, exposing the top electrodes of the capacitors. The contact openings are formed using conventional mask and etch techniques. For example, such techniques include depositing a resist mask, patterning the resist mask, and anisotropically etching the protective, barrier, and ILD to form the contact openings. After the contact openings are formed, the resist mask is removed. A recovery anneal in an oxygen ambient can be performed, if necessary, to improve the ferroelectric properties of the capacitor. The protective layer prevents the plug from oxidizing as a result of the anneal.

Figure 9:
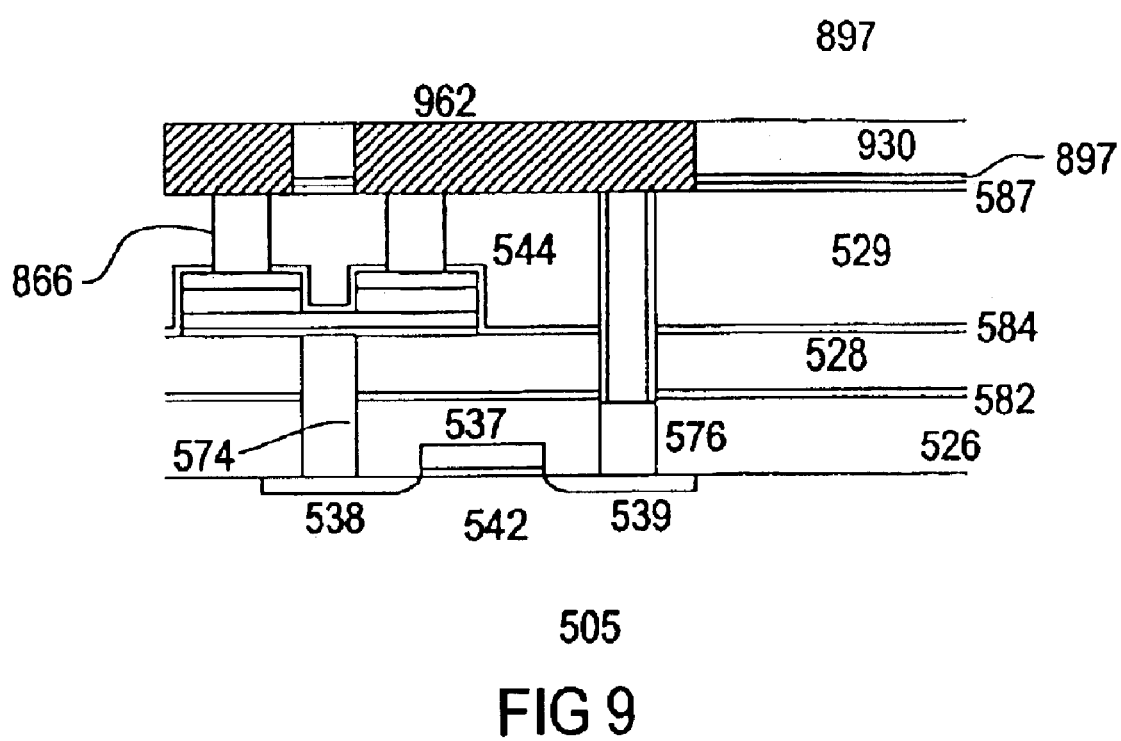

Referring to FIG. 9, a conductive layer is deposited on the substrate, filling the contact openings 866. Excess conductive material is removed from the surface of the protective layer by CMP. Preferably, the CMP stops on the protective layer 897. Alternatively, the CMP can remove the protective layer, stopping on the barrier layer 587.

In one embodiment, conductors 962 are formed to couple the plugs 866 to respective AATE plugs forming a memory cell of a group arranged in a series architecture. The conductors can be formed by various techniques. In one embodiment, the conductors are formed by damascene technique. Such technique includes first depositing a dielectric layer 930 on the substrate. The dielectric layer is patterned using conventional mask and etch techniques to form trenches 962. The etch can use the barrier layer 587 as an etch stop, ensuring that the surface of the plugs are exposed. Alternatively, the etch can remove the barrier layer as well, exposing the surface of the ILD layer 529. The trenches are filled with a conductive material such as aluminum. Other types of conductive materials can also be used. Excess conductive material is then removed by, for example, CMP or other techniques.

In an alternative embodiment, the conductors are formed by an RIE process. To form conductors by RIE, the protective layer needs to be removed to expose the surface of the plugs. A conductive layer Is then deposited and patterned to create conductors 962. After the conductors are formed, a dielectric layer is deposited thereover.

In yet another embodiment, a dual damascene technique is used to form conductors and vias 866. This Includes, for example, depositing a dielectric layer 930 on the surface of the substrate, etching the dielectric layer to form vias 866, etching the dielectric layer to form trenches, filling the vias and trenches with conductive material, and polishing the substrate to remove excess conductive materials from the surface of the dielectric layer.

In another embodiment of the invention, the AATE plug is coupled to a bitline while the plug 866 is coupled to a plateline. The bitline and plateline can be formed using various conventional techniques. In yet another embodiment, the plug 866 is coupled to a reference voltage such as $V_{DD}/2$. Other reference voltage levels are also useful. This is particularly useful for DRAM applications.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A process for forming an integrated circuit comprising:
   providing a substrate prepared with:
   a transistor having first and second diffusion regions and a gate,
   a capacitor having top and bottom electrodes with a capacitor dielectric layer between the electrodes,
   a bottom electrode plug coupling the bottom electrode to the first diffusion region;
   depositing an interlevel dielectric layer on the substrate covering the capacitor;
   depositing a surface barrier layer over the interlevel dielectric layer;
   forming a hard mask over the surface barrier layer, the hard mask and the surface barrier layer comprising different materials;
   patterning the mask layer to form an opening corresponding to a deep contact via;

forming the deep contact via in the interlevel dielectric layer, the contact via includes substantially vertical sidewalls;

depositing a dielectric barrier layer on the substrate, the dielectric barrier layer lines the sidewalls and bottom of the contact via;

etching the substrate to remove horizontal components of the dielectric barrier layer; and forming a contact plug in the deep contact via, the contact plug providing electrical coupling to the second diffusion region.

2. The process of claim 1 wherein the capacitor comprises a ferroelectric capacitor having a capacitor dielectric layer comprising a ferroelectric material.

3. The process of claim 2 further comprises forming a bitline coupled to the plug.

4. The process of claim 3 wherein the substrate is further prepared with a lower barrier layer located between the transistor and capacitor.

5. The process of claim 3 further comprises providing an encapsulation layer over the capacitor, the encapsulation layer inhibits diffusion of hydrogen and oxygen.

6. The process of claim 2 further comprises forming interconnections for coupling the plug to the top electrode.

7. The process of claim 6 wherein the substrate is further prepared with a lower barrier layer located between the transistor and capacitor.

8. The process of claim 6 further comprises providing an encapsulation layer over the capacitor, the encapsulation layer inhibits diffusion of hydrogen and oxygen.

9. The process of claim 2 wherein the substrate is further prepared with a lower barrier layer located between the transistor and capacitor.

10. The process of claim 2 further comprises providing an encapsulation layer over the capacitor, the encapsulation layer inhibits diffusion of hydrogen and oxygen.

11. The process of claim 1 further comprises forming a bitline coupled to the plug.

12. The process of claim 11 wherein the substrate is further prepared with a lower barrier layer located between the transistor and capacitor.

13. The process of claim 11 further comprises providing an encapsulation layer over the capacitor, the encapsulation layer inhibits diffusion of hydrogen and oxygen.

14. The process of claim 1 further comprises forming interconnections for coupling the plug to the top electrode.

15. The process of claim 14 wherein the substrate is further prepared with a lower barrier layer located between the transistor and capacitor.

16. The process of claim 14 further comprises providing an encapsulation layer over the capacitor, the encapsulation layer inhibits diffusion of hydrogen and oxygen.

17. The process of claim 1 wherein the substrate is further prepared with a lower barrier layer located between the transistor and capacitor.

18. The process of claim 1 further comprises providing an encapsulation layer over the capacitor, the encapsulation layer inhibits diffusion of hydrogen and oxygen.

19. The process of claim 1 or 2 wherein:
the substrate is further prepared with a lower portion of the contact plug coupled to the second diffusion region, the lower portion of the contact plug is located beneath a lower barrier layer disposed between the transistor and capacitor; and
forming the contact via exposes an upper surface of the lower portion of the plug.

20. The process of claim 19 wherein forming the contact via comprises:
depositing an upper barrier layer on the surface of the interlevel dielectric layer;
depositing the hard mask layer on the substrate;
patterning the hard mask layer to form an opening corresponding to a location of the contact via; and
etching the interlevel dielectric layer to form the contact via.

21. The process of claim 20 wherein the barrier layers comprise a material which can inhibit the diffusion of hydrogen and oxygen.

22. The process of claim 20 wherein the barrier layers comprise silicon nitride or aluminum oxide.

23. The process of claim 19 wherein the barrier layers comprise a material which can inhibit the diffusion of hydrogen and oxygen.

24. The process of claim 19 wherein the barrier layers comprise silicon nitride or aluminum oxide.

25. The process of claim 1 or 2 wherein the substrate is further prepared with a lower barrier layer disposed between the transistor and capacitor and forming the contact via exposes the second diffusion region.

26. The process of claim 25 wherein forming the contact via comprises:
depositing an upper barrier layer on the surface of the interlevel dielectric layer;
depositing the hard mask layer on the substrate;
patterning the hard mask layer to form an opening corresponding to a location of the contact via; and
etching the interlevel dielectric layer to form the contact via.

27. The process of claim 26 wherein the barrier layers comprise a material which can inhibit the diffusion of hydrogen and oxygen.

28. The process of claim 26 wherein the barrier layers comprise silicon nitride or aluminum oxide.

29. The process of claim 25 wherein the barrier layers comprise a material which can inhibit the diffusion of hydrogen and oxygen.

30. The process of claim 25 wherein the barrier layers comprise silicon nitride or aluminum oxide.

31. A process for forming an integrated circuit comprising:
providing a substrate prepared with an interlevel dielectric layer on a surface of the substrate;
forming a first barrier layer on the interlevel dielectric layer;
depositing a hard mask layer on the first barrier layer;
patterning the hard mask to create an opening corresponding to a deep contact via;
forming a the deep contact via in the interlevel dielectric layer to expose a region to which a contact plug is to be coupled, the deep contact via includes substantially vertical side walls;
depositing a second dielectric barrier layer on the substrate, the second dielectric barrier layer lines the sidewalls and bottom of the contact via;
etching the substrate to remove horizontal components of the second dielectric barrier layer to expose a top surface of the bottom contact via; and
forming the contact plug in the via.

* * * * *